(12) United States Patent
Hayata et al.

(10) Patent No.: US 10,816,322 B2
(45) Date of Patent: Oct. 27, 2020

(54) BONDING APPARATUS AND METHOD FOR DETECTING HEIGHT OF BONDING TARGET

(71) Applicant: SHINKAWA LTD., Tokyo (JP)

(72) Inventors: Shigeru Hayata, Tokyo (JP); Hiromi Tomiyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/463,379

(22) PCT Filed: Jul. 27, 2017

(86) PCT No.: PCT/JP2017/027171
§ 371 (c)(1),
(2) Date: May 23, 2019

(87) PCT Pub. No.: WO2018/096728
PCT Pub. Date: May 31, 2018

(65) Prior Publication Data
US 2020/0132438 A1    Apr. 30, 2020

(30) Foreign Application Priority Data
Nov. 24, 2016 (JP) ................................ 2016-227938

(51) Int. Cl.
*G01B 11/06* (2006.01)
*G06T 7/00* (2017.01)

(52) U.S. Cl.
CPC ........ *G01B 11/0608* (2013.01); *G06T 7/0004* (2013.01); *G06T 2207/10152* (2013.01); *G06T 2207/30148* (2013.01)

(58) Field of Classification Search
None
See application file for complete search history.

(56) References Cited

U.S. PATENT DOCUMENTS

| 6,428,171 B1 | 8/2002 | Aoki et al. |
| 2005/0094865 A1 | 5/2005 | Cheng et al. |

FOREIGN PATENT DOCUMENTS

| JP | 2001108418 | 4/2001 |
| JP | 2002305214 | 10/2002 |

(Continued)

OTHER PUBLICATIONS

"International Search Report (Form PCT/ISA/210) of PCT/JP2017/027171," dated Sep. 5, 2017, with English translation thereof, pp. 1-4.

*Primary Examiner* — James M Anderson, II
(74) *Attorney, Agent, or Firm* — JCIPRNET

(57) ABSTRACT

A bonding apparatus having an optical system, an imaging element for acquiring an image formed by the optical system as a picture, an illumination unit for illuminating an electronic component, and a control part for processing the image acquired by the imaging element, the control part illuminating the electronic component through a first inclined optical path inclined with respect to the optical axis of a first portion of the optical system facing the electronic component and acquiring a first image, illuminating the electronic component through a second inclined optical path inclined toward the opposite side from the first inclined optical path with respect to the optical axis and acquiring a second image of the electronic component as a subject, and calculating an amount of variation from a reference height of the electronic component on the basis of the positional offset amount between the first image and the second image.

11 Claims, 11 Drawing Sheets

(56) References Cited

FOREIGN PATENT DOCUMENTS

| | | |
|---|---|---|
| JP | 2008164324 | 7/2008 |
| JP | 2012038992 | 2/2012 |
| JP | 2013205407 | 10/2013 |
| WO | 9851993 | 11/1998 |

BONDING APPARATUS AND METHOD FOR DETECTING HEIGHT OF BONDING TARGET

CROSS-REFERENCE TO RELATED APPLICATION

This application is a 371 application of the International PCT application serial no. PCT/JP2017/027171, filed on Jul. 27, 2017, which claims the priority benefit of Japan Patent Application No. 2016-227938, filed on Nov. 24, 2016. The entirety of each of the above-mentioned patent applications is hereby incorporated by reference herein and made a part of this specification.

TECHNICAL FIELD

The present invention relates to a bonding apparatus and a method thereof for detecting the height of a bonding target using an imaging apparatus.

BACKGROUND ART

As an apparatus for mounting a semiconductor chip (die) on a wiring substrate or in a lead frame, a die bonding apparatus or a flip-chip bonding apparatus is used.

Since a substrate or a lead frame has a variation in thickness, for example, a method of measuring a distance from a reference point to a substrate surface through a non-contact distance sensor using ultrasonic waves or a laser and detecting the height of the substrate or the lead frame from the measurement result is used in such apparatus (see, for example, Patent Literature 1).

In addition, a method of detecting the height of a paste from a substrate surface by a positional offset between an image of a detection pattern projected onto the substrate surface in an inclined direction and an image of a detection pattern projected onto a surface of the paste applied on the substrate in an inclined direction is also used in a die bonding apparatus (see, for example, Patent Literature 2).

CITATION LIST

Patent Literature

[Patent Literature 1]
Japanese Unexamined Patent Application Publication No. 2002-305214
[Patent Literature 2]
Japanese Unexamined Patent Application Publication No. 2012-38992

SUMMARY OF INVENTION

Technical Problem

However, in order to detect the height of a substrate or the like, in a case where a dedicated instrument for detecting the height of a substrate or a semiconductor chip or the like (bonding target) bonded onto the substrate, such as a distance sensor or a detection pattern projector, is mounted in a bonding apparatus, there is a problem in that the bonding apparatus becomes complicated.

In addition, recently, laminated chips obtained by overlapping chips in multiple layers have been increasing. In a wire bonding apparatus and a die bonding apparatus, there has been an increasing need to measure the number of stages in which bonding is presently performed. In addition, in a flip-chip bonding apparatus, there is a need to detect the angle of inclination (flatness) of a lower-stage chip. Further, in a tool-replaceable bonding apparatus, for example, a die bonding apparatus, a flip-chip bonding apparatus or the like, there is a need to detect the inclination or flatness of a replaced tool. In this manner, recently, in a bonding apparatus, there has been an increasing need to perform various three-dimensional measurements or height measurements within the apparatus.

Consequently, an object of the present invention is to detect the height of a component or a bonding target of a bonding apparatus using a simple method.

Solution to Problem

According to the present invention, there is provided a bonding apparatus including: an optical system that forms an image of a bonding target having a predetermined pattern; an imaging element that acquires the image formed by the optical system as a picture; an illumination unit that includes a plurality of light sources and illuminates the bonding target through an optical path of the optical system; and a control part that processes the image acquired by the imaging element, wherein the control part illuminates the bonding target through a first optical path of the optical system facing the bonding target and causes the imaging element to acquire a first image an image of the predetermined pattern of the bonding target as a first pattern image, illuminates the bonding target through a second optical path inclined with respect to the first optical path and causes the imaging element to acquire the image of the predetermined pattern of the bonding target as a second pattern image, and calculates an amount of variation from a reference height of the bonding target on the basis of an positional offset amount between the first pattern image and the second pattern image.

In the bonding apparatus of the present invention, the control part may illuminate the bonding target through the first optical path by turning on a first light source disposed at a first position within the illumination unit and turning off other light sources and cause the imaging element to acquire the first pattern image, and illuminate the bonding target through the second optical path by turning on a second light source disposed at a second position different from the first position and turning off other light sources and cause the imaging element to acquire the second pattern image.

In the bonding apparatus of the present invention, the first optical path may be a first inclined optical path inclined with respect to an optical axis of a first portion of the optical system facing the bonding target, the second optical path may be a second inclined optical path inclined toward the opposite side from the first inclined optical path with respect to the optical axis of the first portion, and the control part may illuminate the bonding target through the first inclined optical path by turning on a first light source disposed at a first position eccentric from the optical axis of the first portion within the illumination unit and turning off other light sources and cause the imaging element to acquire the first pattern image, and illuminate the bonding target through the second inclined optical path by turning on a second light source disposed at a second position on the opposite side of the first position with respect to the optical axis of the first portion and turning off other light sources and cause the imaging element to acquire the second pattern image.

In the bonding apparatus of the present invention, the first optical path may be a vertical optical path along an optical axis of a first portion of the optical system facing the bonding target, the second optical path may be a second inclined optical path inclined with respect to the optical axis of the first portion, and the control part may illuminate the bonding target through the vertical optical path by turning on a first light source disposed coaxially with the optical axis of the first portion within the illumination unit and turning off other light sources and cause the imaging element to acquire the first pattern image, and illuminate the bonding target through the second inclined optical path by turning on a second light source disposed at a second position separated from the optical axis of the first portion and turning off other light sources and cause the imaging element to acquire the second pattern image.

In the bonding apparatus of the present invention, the first optical path may be a first inclined optical path inclined with respect to an optical axis of a first portion of the optical system facing the bonding target, the second optical path may be a second inclined optical path inclined toward the opposite side from the first inclined optical path with respect to the optical axis of the first portion, the bonding apparatus may include a shielding plate that is rotatable around the optical axis of the first portion and provided with a hole for transmitting light from the illumination unit and eccentric from a center, the center being coaxial with the optical axis of the first portion of the optical system, and the control part may cause the hole to locate at a first position eccentric from the optical axis of the first portion when the illumination unit is turned on and the first pattern image is acquired, and to locate the hole at a second position on the opposite side of the first position with respect to the optical axis of the first portion when the second pattern image is acquired.

In the bonding apparatus of the present invention, the first optical path may be a first inclined optical path inclined with respect to an optical axis of a first portion of the optical system facing the bonding target, the second optical path may be a second inclined optical path inclined toward the opposite side from the first inclined optical path with respect to the optical axis of the first portion, the optical system may include a lens and a diaphragm disposed between the lens and the imaging element, and the diaphragm may have an opening allowing passage of reflected light with which the bonding target is illuminated through the first inclined optical path or the second inclined optical path at a position eccentric from an optical axis of a second portion passing through the diaphragm of the optical system.

In the bonding apparatus of the present invention, the diaphragm may be rotatable around the optical axis of the second portion, and the control part may set the position of the opening to a position allowing passage of reflected light with which the bonding target is illuminated through the first inclined optical path when the first pattern image is acquired by the imaging element, and set the position of the opening to a position allowing passage of reflected light with which the bonding target is illuminated through the second inclined optical path when the second pattern image is acquired by the imaging element.

In the bonding apparatus of the present invention, the optical system may be a telecentric optical system.

According to the present invention, there is provided a method for calculating an amount of variation from a reference height of a bonding target having a predetermined pattern, the method including: preparing an imaging apparatus including an optical system that forms an image of the bonding target, an imaging element that acquires the image formed by the optical system as a picture, an illumination unit that includes a plurality of light sources and illuminates the bonding target through an optical path of the optical system, and a control part that processes the image acquired by the imaging element; illuminating the bonding target through a first optical path of the optical system facing the bonding target and causing the imaging element to acquire an image of the predetermined pattern of the bonding target as a first pattern image; illuminating the bonding target through a second optical path inclined with respect to the first optical path and causing the imaging element to acquire the image of the predetermined pattern of the bonding target as a second pattern image; and calculating an amount of variation from a reference height of the bonding target on the basis of an positional offset amount between the first pattern image and the second pattern image.

In the method for calculating an amount of variation from a reference height of a bonding target according to the present invention, the first optical path may be a first inclined optical path inclined with respect to an optical axis of a first portion of the optical system facing the bonding target, the second optical path may be a second inclined optical path inclined toward the opposite side from the first inclined optical path with respect to the optical axis of the first portion, and the method further including: illuminating the bonding target through the first inclined optical path by turning on a first light source disposed at a first position eccentric from the optical axis of the first portion within the illumination unit and turning off other light sources and causing the imaging element to acquire the first pattern image; and illuminating the bonding target through the second inclined optical path by turning on a second light source disposed at a second position on the opposite side of the first position with respect to the optical axis of the first portion and turning off other light sources and causing the imaging element to acquire the second pattern image.

In the method for calculating an amount of variation from a reference height of a bonding target according to the present invention, the first optical path may be a first inclined optical path inclined with respect to an optical axis of a first portion of the optical system facing the bonding target, the second optical path may be a second inclined optical path inclined toward the opposite side from the first inclined optical path with respect to the optical axis of the first portion, the optical system may include a lens and a diaphragm disposed between the lens and the imaging element, the diaphragm may have an opening allowing passage of reflected light with which the bonding target is illuminated through the first inclined optical path or the second inclined optical path at a position eccentric from an optical axis of a second portion passing through the diaphragm of the optical system, and may be rotatable around the optical axis of the second portion, the position of the opening may be set to a position allowing passage of reflected light with which the bonding target is illuminated through the first inclined optical path when the first pattern image is acquired by the imaging element, and the position of the opening may be set to a position allowing passage of reflected light with which the bonding target is illuminated through the second inclined optical path when the second pattern image is acquired by the imaging element.

Advantageous Effects of Invention

According to the present invention, it is possible to detect the height of a component or a bonding target of the bonding apparatus using a simple method.

DESCRIPTION OF EMBODIMENTS

Figure 1:
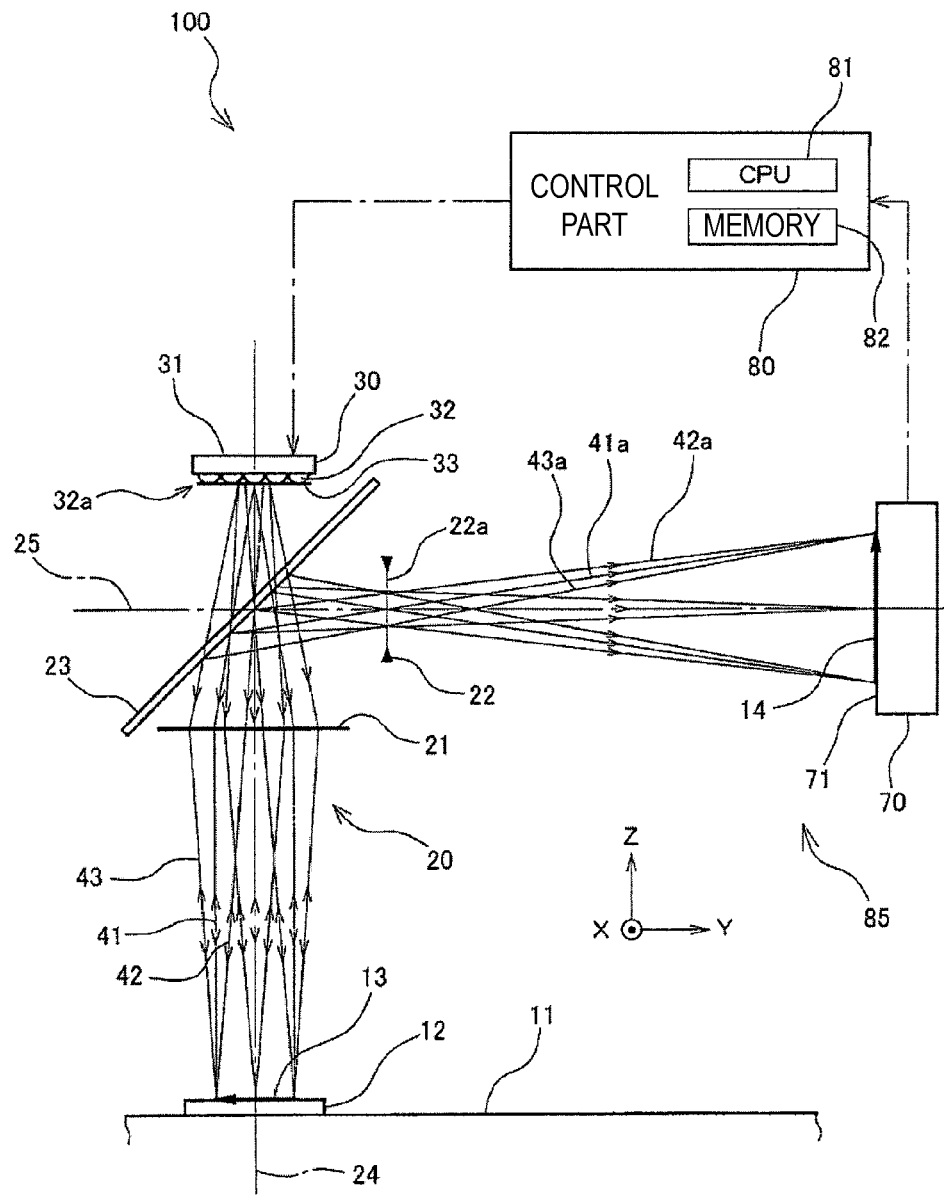
FIG. 1 is a systematic diagram illustrating a configuration of a bonding apparatus according to an embodiment of the present invention.

Hereinafter, a bonding apparatus 100 of the present embodiment will be described with reference to the accompanying drawings. As shown in FIG. 1, the bonding apparatus 100 includes an optical system 20, an imaging element 70, an illumination unit 30, a control part 80, and a bonding stage 11 for vacuum-absorbing a substrate 12. The bonding apparatus 100 is designed to bond an electronic component 13 (bonding target) such as a semiconductor chip, attached to a bonding head (not shown) and adsorbed by a bonding tool, on the substrate 12. Meanwhile, in each drawing, the electronic component 13 is indicated by an arrow in order to show the direction of the electronic component 13 clearly. In the following description, the end of a direction in which the arrow points is defined as a leading end, the end on the opposite side of a direction in which the arrow points is defined as a base part, and the middle between the leading end and the base part is defined as a center. In addition, the electronic component 13 is a subject.

The optical system 20 is constituted by a lens 21 disposed on an optical axis 24 of a first portion in a Z-axis direction which is a direction toward the electronic component 13 which is a subject, a half mirror 23 disposed between the illumination unit 30 and the lens 21, and a diaphragm 22 disposed between the half mirror 23 and the imaging element 70. A dashed-dotted line extending from the half mirror 23 through the center of the diaphragm 22 to the imaging element 70 represents an optical axis 25 of a second portion in a Y direction through the diaphragm 22.

A distance from the principal plane of the lens 21 to the diaphragm 22 is a focal length f of the lens 21, and constitutes a front telecentric optical system. In addition, a distance from the principal plane of the lens 21 to a diffusion plate 33 or an LED 32 to be described later is also set to a focal length f. Therefore, the optical system 20 serves as a telecentric optical system.

The optical system 20 forms an image of the electronic component 13 indicated by an arrow in FIG. 1 on an imaging surface 71 of the imaging element 70. The imaging element 70 acquires the image formed on the imaging surface 71 as an image 14 of the electronic component 13, and outputs the acquired image to the control part 80.

The illumination unit 30 is constituted by a base body part 31, a plurality of LEDs 32 which are light sources attached to the base body part 31, and a diffusion plate 33 attached to the Z-direction lower side of the plurality of LEDs 32. The plurality of LEDs 32 form an LED array 32a spreading in a plane shape. Meanwhile, the diffusion plate 33 may not be provided.

The control part 80 is a computer including a CPU 81 that performs arithmetic operations or information processing therein and a memory 82 that stores a control program, control data, a map, or the like. Each LED 32 of the illumination unit 30 is turned on or off by a command from the control part 80. Meanwhile, the optical system 20, the illumination unit 30, the imaging element 70, and the control part 80 constitute an imaging apparatus 85 of the bonding apparatus 100.

An optical path when an image of the electronic component 13 (indicated by an arrow in the drawing) bonded on the substrate 12 is acquired by the imaging apparatus 85 of the bonding apparatus 100 configured in this manner will be described. Meanwhile, the upper plane of the substrate 12 is a reference plane, and is a focusing plane of the optical system 20. As shown in FIG. 1, in a case where each LED 32 emits light, light from each LED passes through the half mirror 23 while spreading, and passes through the lens 21 toward the electronic component 13. As shown in FIG. 1, illumination light having passed through the lens 21 illuminates the entirety of the electronic component 13 while converging as shown by solid lines 41, 42, and 43. Reflected light reflected from the surface of the electronic component 13 travels toward the lens 21 while spreading as shown by solid lines 43, 41, and 42, and passes through the lens 21 toward the half mirror 23. The light having passed through the lens 21 toward the half mirror 23 is reflected by the half mirror 23, passes through an opening 22a of the diaphragm 22, and focuses on the imaging surface 71 of the imaging element 70 as shown by solid lines 41a, 42a, and 43a. In this manner, the image of the electronic component 13 on the focusing plane (reference plane) of the optical system 20 is formed on the imaging surface 71 of the imaging element 70. The imaging element 70 acquires the formed image as the image 14 of the electronic component 13, and outputs the acquired image to the control part 80.

Figure 2:
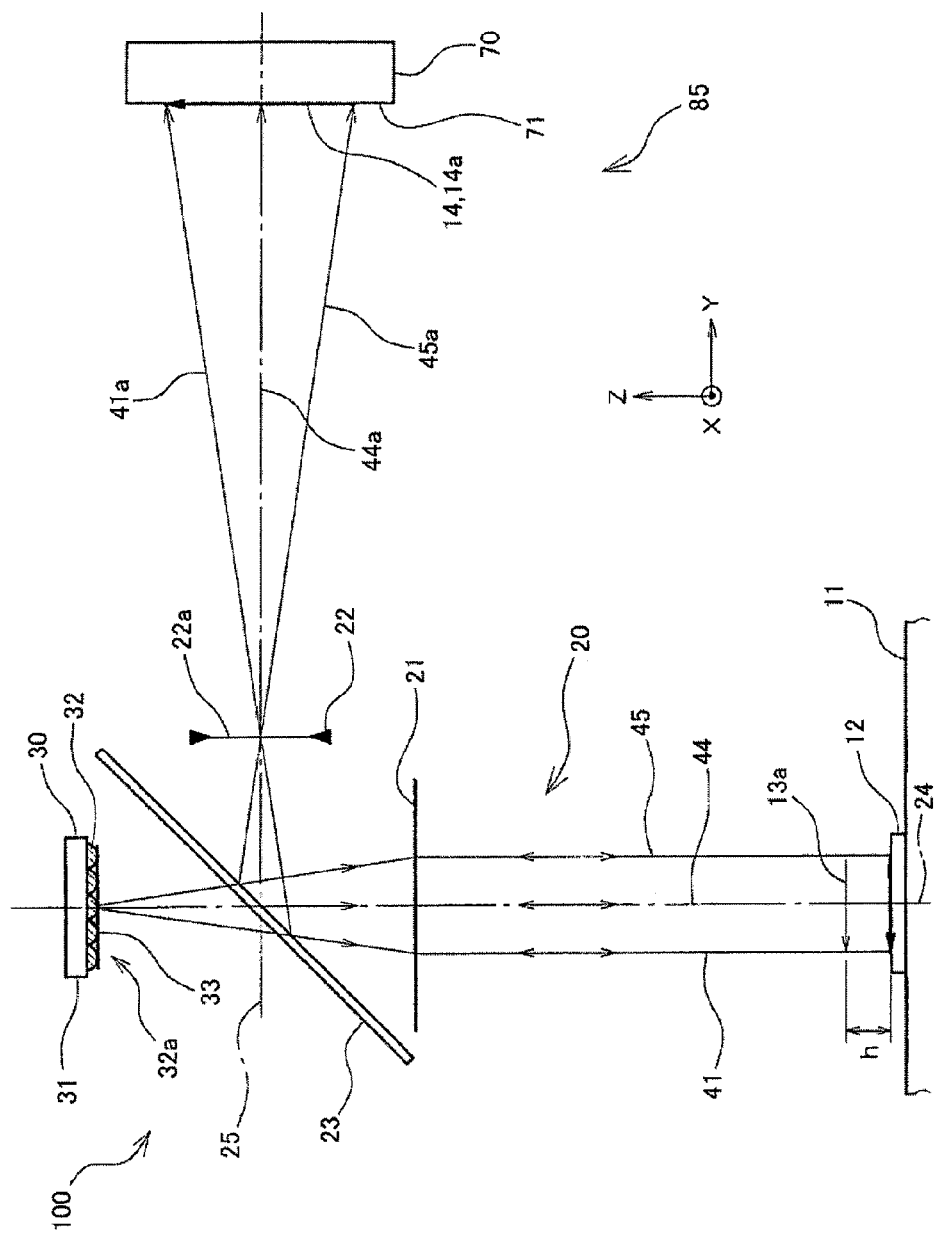
FIG. 2 is a diagram illustrating an optical system in the bonding apparatus according to the embodiment of the present invention.

Reference will be made to FIG. 2 to describe in detail how light from an LED 32 located at the position of the optical axis 24 of the first portion of the illumination unit 30, that is, an LED 32 disposed at the center of the illumination unit 30, travels to reach the imaging surface 71. Meanwhile, LEDs 32 that are hatched in FIG. 2 represent LEDs which are turned on. As shown in FIG. 2, light from the LEDs 32 enters the lens 21 through the half mirror 23 while diffusing toward the lens 21. The light having come out of the lens 21 proceeds to the electronic component 13 which is a subject through optical paths 41, 44, and 45 parallel to the optical axis 24 of the first portion, and illuminates the electronic component 13 with a beam of light parallel to the optical axis 24 of the first portion. That is, the electronic component 13 is illuminated with a parallel beam of light from a vertically upward direction. Since the illumination light illuminates from the vertically upward direction of the electronic component 13, the reflected light reflected from the surface of the electronic component 13 proceeds in the vertically upward direction, passes through the lens 21 by way of the same optical paths 41, 44, and 45 as the illumination light, proceeds to the half mirror 23, and is reflected by the half mirror 23. After the reflected light converges on the diaphragm 22 located at the position of the focal length f from the principal plane of the lens 21 as shown by optical paths 41a, 44a, and 45a, the reflected light reaches the imaging surface 71 of the imaging element 70 while spreading, and is formed as the image 14.

As described above, in the case shown in FIG. 2, the illumination light faces the vertically upward direction of the electronic component 13, and the reflected light reflected from the surface of the electronic component 13 proceeds in the vertically upward direction. Therefore, even in the case of an electronic component 13a which is higher than the focusing plane (reference plane) of the optical system 20 only by a height h, both the illumination light and the reflected light reach the imaging surface 71 through the optical paths 41, 44, and 45 and the optical paths 41a, 44a, and 45a. Therefore, an image 14a of the electronic component 13a which is formed on the imaging surface 71 is located at the same position as the image 14 of the electronic component 13, and a positional offset does not occur between the image 14 and the image 14a.

Next, reference will be made to FIG. 3 to describe an optical path when an image of the electronic component 13 is acquired in a case where only a hatched LED 32 on the right side of the illumination unit 30 is turned on, and a white LED 32 on the left side from the center is not turned on. The LED 32 of a right portion is a light source located at a position eccentric from the optical axis 24 of the first portion. In the following, a case in which light from the LED 32 of the right portion illuminates the leading end of the electronic component 13 indicated by an arrow will be described by way of example.

Figure 3:
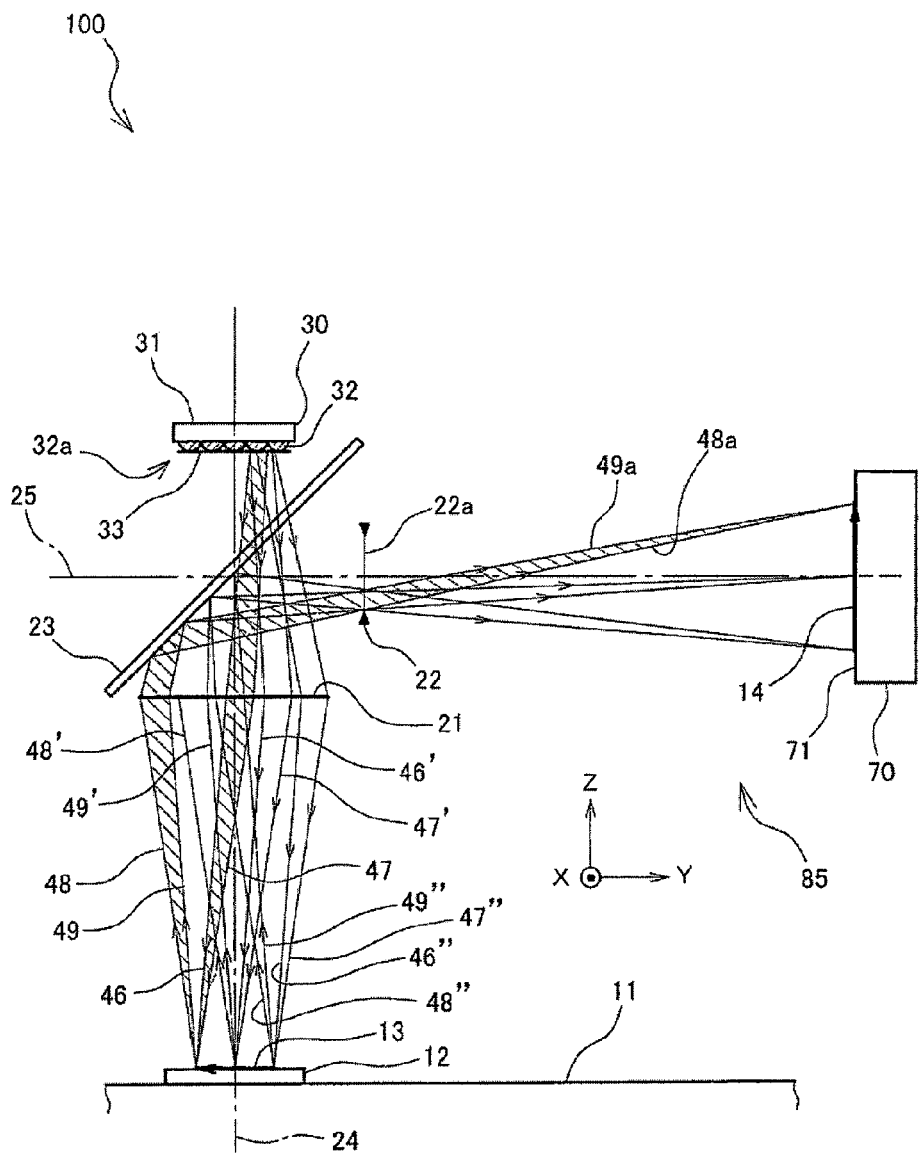
FIG. 3 is an optical path diagram in a case where, in the bonding apparatus according to the embodiment of the present invention, a subject is illuminated with illumination light from the diagonal upper right by turning on right LEDs in an illumination unit and an image of the subject is acquired.

As shown in FIG. 3, the light from the LED 32 of the right portion enters the lens 21 while traveling along an optical path inclined to the right with respect to the optical axis 24 of the first portion from the LED 32 as shown by a hatched region interposed between a solid line 46 and a solid line 47. The illumination light having passed through the lens 21 converges on the arrow end of the electronic component 13 and illuminates the arrow end of the electronic component 13. As shown by a hatched region interposed between a solid line 48 and a solid line 49, the light reflected from the arrow end of the electronic component 13 is reflected by the half mirror 23 through the lens 21 while traveling along an optical path inclined to the left with respect to the optical axis 24 of the first portion, passes through the lower portion of the opening 22a of the diaphragm 22 located at a position eccentric from the optical axis 25 of the second portion, and reaches the imaging surface 71 of the imaging element 70 while traveling along an optical path shown by a hatched region interposed between a solid line 48a and a solid line 49a. Similarly, in a case where the light from the LED 32 of the right portion illuminates the center and root part of the electronic component 13, the center and root part of the electronic component 13 are illuminated with light traveling along the optical path inclined to the right with respect to the optical axis 24 of the first portion, and the reflected light passes through the lower portion of the opening of the diaphragm 22 while traveling along the optical path inclined to the left with respect to the optical axis 24 of the first portion, and reaches the imaging surface 71 of the imaging element 70.

Figure 4:
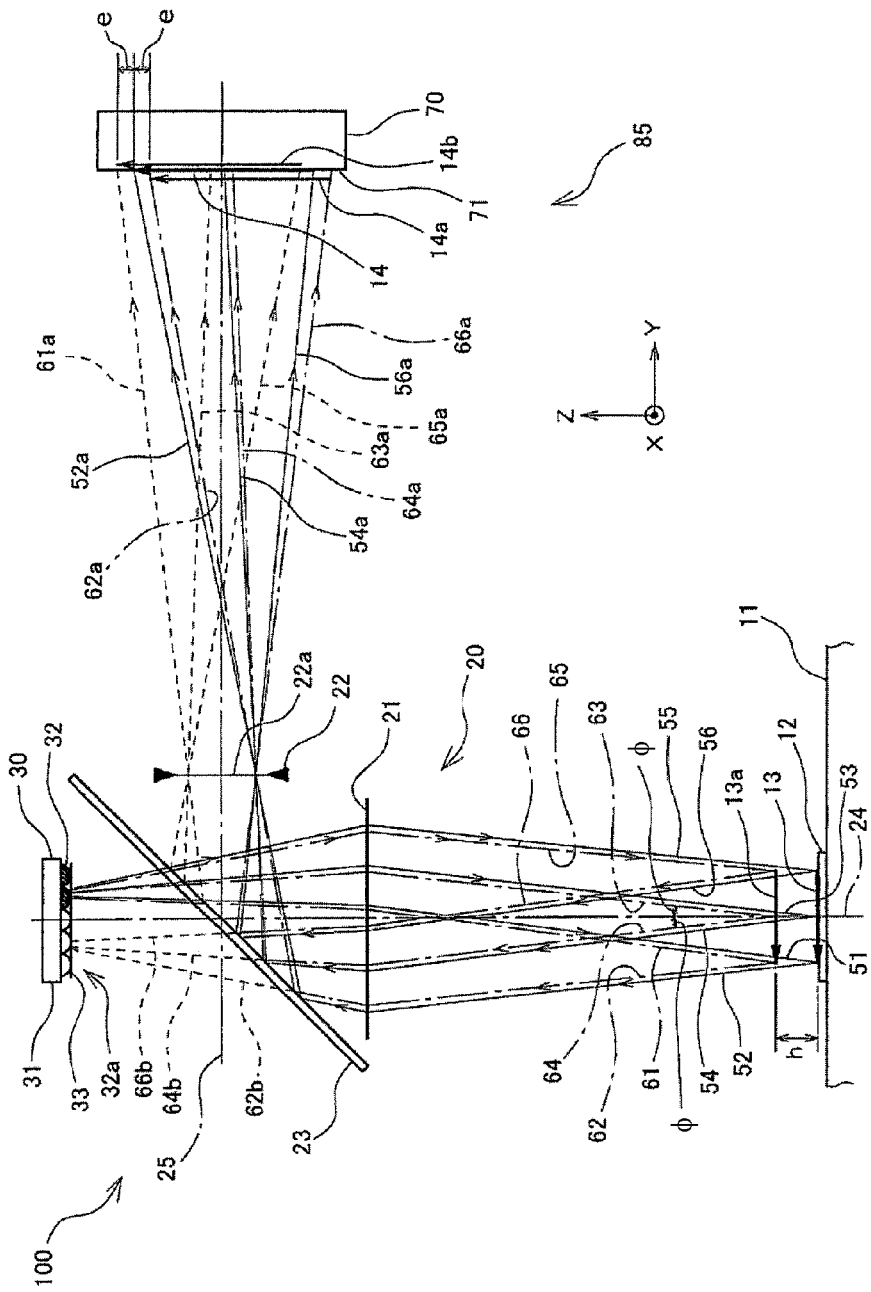
FIG. 4 is an optical path diagram illustrating a shift occurring in images on an imaging surface due to the height of a subject when the image of the subject is acquired through the optical path shown in FIG. 3.

Next, reference will be made to FIG. 4 to describe in detail how light from one LED 32 shifted to the right from the optical axis 24 of the first portion travels to reach the imaging surface 71. An optical path 51 in FIG. 4 represents an optical path at the center of the hatched region interposed between the solid line 46 and the solid line 47 shown in FIG. 3, and an optical path 52 represents an optical path at the center of the hatched region interposed between the solid line 48 and the solid line 49 shown in FIG. 3. An optical path 53 represents the center of an optical path of illumination light toward the center of the electronic component 13 shown by two solid lines 46' and 47' in FIG. 3, and an optical path 54 represents the center of an optical path of reflected light from the center of the electronic component 13 shown by two solid lines 48' and 49' in FIG. 3. Similarly, optical paths 55 and 56 represent the center of an optical path of illumination light of the root part of the electronic component 13 shown by two solid lines 46" and 47" in FIG. 3 and an optical path of reflected light from the root of the electronic component 13 shown by two solid lines 48" and 49" in FIG. 3.

As shown in FIG. 4, the light from one LED 32 out of LEDs 32 shifted to the right from the optical axis 24 of the first portion illuminates the leading end of the electronic component 13 through a first inclined optical path inclined only at an angle φ from the optical axis 24 of the first portion to the right or the optical path 51 which is a first optical path, and the reflected light reflected from the leading end of the electronic component 13 passes through the lens 21 by the optical path 52 inclined only at an angle φ from the optical axis 24 of the first portion to the left, is reflected by the half mirror 23, and reaches the imaging surface 71 along an optical path 52a passing through the lower portion of the opening 22a of the diaphragm 22 located at a position eccentric from the optical axis 25 of the second portion. Here, the optical path 51 and the optical path 52 are line-symmetric with respect to the optical axis 24 of the first portion. Similarly, the light from one LED 32 illuminates the center and base part of the electronic component 13 through the first inclined optical path inclined only at an angle φ from the optical axis 24 of the first portion to the right or the optical paths 53 and 55 which are first optical paths, and the reflected light passes through the lens 21 by the optical paths 54 and 56 inclined only at an angle φ from the optical axis 24 of the first portion to the left, is reflected by the half mirror 23, and reaches the imaging surface 71 along optical paths 54a and 56a passing through the lower portion of the opening 22a of the diaphragm 22 located at a position eccentric from the optical axis 25 of the second portion. As shown in FIG. 4, the image 14 is formed on the imaging surface 71. The optical path 53 and the optical path 54, and the optical path 55 and the optical path 56 are line-symmetric with respect to the optical axis 24 of the first portion.

Next, an optical path in a case where the light from one LED 32 illuminates the surface of the electronic component 13a which is higher than the focusing plane (reference plane) of the optical system 20 only by a height h, and the image 14a of the electronic component 13a is formed on the imaging surface 71 will be described.

As shown in FIG. 4, the light from one LED 32 illuminates the leading end of the electronic component 13a which is higher than the electronic component 13 only by a height h through the first inclined optical path shown by a dashed-dotted line parallel to the optical path 51 or an optical path 61 which is a first optical path. The reflected light reaches the half mirror 23 from the lens 21 through an optical path 62 shown by a dashed-dotted line parallel to the optical path 52, is reflected by the half mirror 23, and reaches the imaging surface 71 along an optical path 62a passing through the lower side of the opening 22a of the diaphragm 22 similarly to the optical path 52a. As shown by the optical path 62 of FIG. 4, when the height of the electronic component 13 increases only by a height h in a case where the optical path is inclined from the optical axis 24 of the first portion, a position at which the reflected light is reflected by the half mirror 23 is shifted further upward than in the case of the optical path 51. On the other hand, since the diaphragm 22 is located at the position of the focal length f from the principal plane of the lens 21, both the optical path 52a and the optical path 62a leading from the half mirror 23 to the imaging surface 71 pass through the same point on the diaphragm 22. Therefore, as shown by the optical path 62a of FIG. 4, the leading end of the image 14a of the electronic component 13a is shifted further downward than the leading end of the image 14 of the electronic component 13 only by a distance e. Similarly, since the light from one LED 32 illuminates the center and base part of the electronic component 13a through the first inclined optical path shown by a dashed-dotted line in FIG. 4 or optical paths 63 and 65 which are first optical paths, and the reflected light reaches the imaging surface 71 through optical paths 64, 64a, 66, and 66a, the center and base part of the image 14a of the electronic component 13a are also shifted further downward only by a distance e similarly to the leading end. In this manner, in a case where the electronic component 13a is illuminated and imaged with illumination from a direction inclined only at an angle φ from the optical axis 24 of the first portion to the right, the image 14a is shifted downward only by a distance e in accordance with the height h of the electronic component 13a.

In addition, light from one LED 32 out of the LEDs 32 shifted to the left from the optical axis 24 of the first portion passes through the half mirror 23 and the left of the lens 21 as shown by a broken line 62b in FIG. 4, and illuminates the leading end of the electronic component 13a through a second inclined optical path inclined only at an angle φ from the optical axis 24 of the first portion to the left or the optical path 62 which is a second optical path reversely to those described previously, and reflected light reflected from the leading end of the electronic component 13a passes through the lens 21 by the optical path 61 inclined only at an angle φ from the optical axis 24 of the first portion to the right, is reflected by the half mirror 23, and reaches the imaging surface 71 along an optical path 61a passing through the upper portion of the opening 22a of the diaphragm 22 located at a position eccentric from the optical axis 25 of the second portion. Similarly, the light from one LED 32 passes through the half mirror 23 and the left of the lens 21 as shown by broken lines 64b and 66b in FIG. 4, and illuminates the center and base part of the electronic component 13a through the second inclined optical path inclined only at an angle φ from the optical axis 24 of the first portion to the left or the optical paths 64 and 66 which are second optical paths, and the reflected light passes through the lens 21 by the optical paths 63 and 65 inclined only at an angle φ from the optical axis 24 of the first portion to the right, is reflected by the half mirror 23, and reaches the imaging surface 71 along optical paths 63a and 65a passing through the upper portion of the opening 22a of the diaphragm 22 located at a position eccentric from the optical axis 25 of the second portion. As shown in FIG. 4, an image 14b is formed on the imaging surface 71. In this manner, in a case where the electronic component 13a is illuminated and imaged with illumination from a direction inclined only at an angle φ from the optical axis 24 of the first portion to the left, the image 14b is shifted upward by only a distance e in accordance with the height h of the electronic component 13a.

Figure 5:
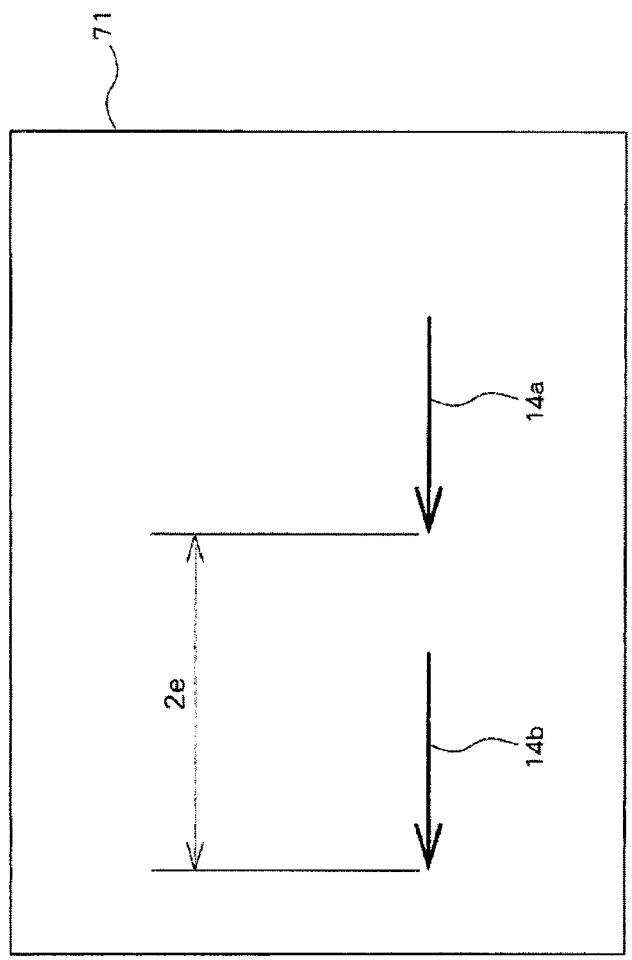
FIG. 5 is a diagram illustrating a positional offset between a first image and a second image on the imaging surface.

Consequently, as shown in FIG. 4, the electronic component 13a which is higher than the focusing plane (reference plane) only by a height h is illuminated by turning on an LED 32 at a first position eccentric from the optical axis 24 of the first portion of the optical system 20 of the illumination unit 30 to the right and turning off other LEDs 32, and the image 14a of the electronic component 13a which is a first image is acquired as shown in FIG. 4. Next, to the contrary, the electronic component 13a which is higher than the focusing plane (reference plane) only by a height h is illuminated by turning on an LED 32 at a second position eccentric from the optical axis 24 of the first portion of the optical system 20 of the illumination unit 30 to the left by turning off other LEDs 32, and the image 14b of the electronic component 13a which is a second image is acquired as shown in FIG. 4. Then, as shown in FIG. 5, the image 14a and the image 14b acquired by the imaging surface 71 of the imaging element 70 are separated from each other by the positional offset amount 2e.

Figure 6:
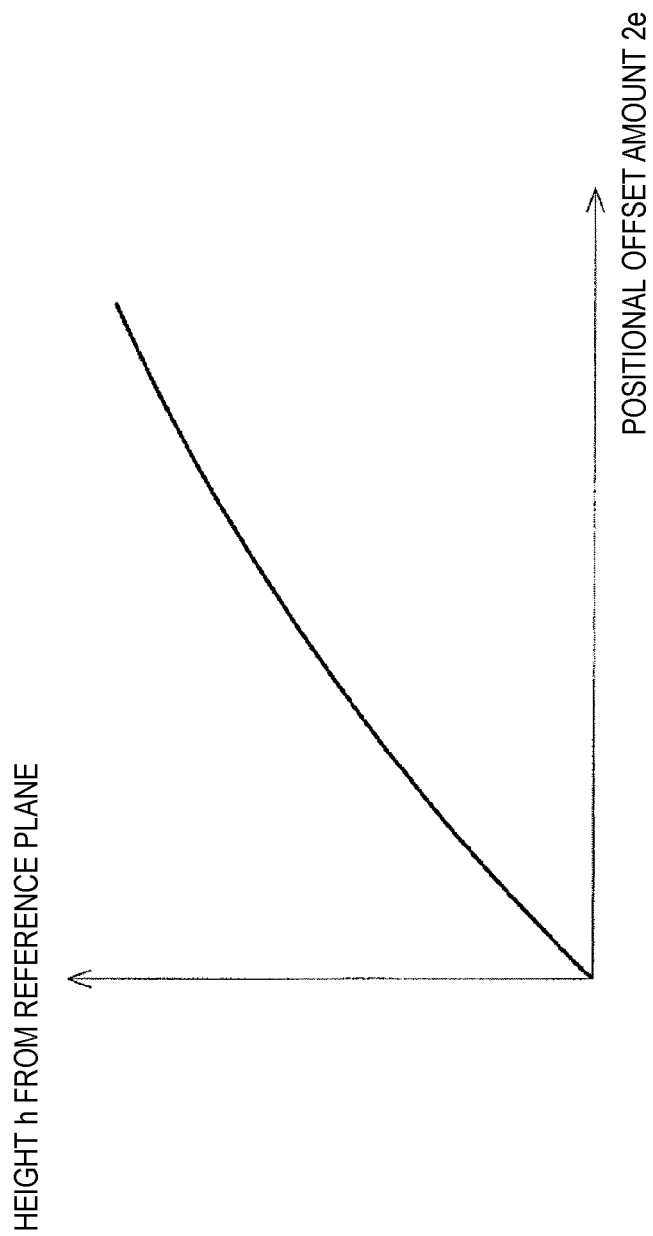
FIG. 6 is a map illustrating a relationship between a positional offset amount 2e of images and a height h from a reference plane.

A relationship between the positional offset amount 2e between the image 14a and the image 14b and the height h of the electronic component 13a from the focusing plane (reference plane) changes, for example, the Z-direction height of the bonding stage 11 or the Z-direction height of the optical system 20 to measure the positional offset amount 2e, and a map as shown in FIG. 6 is created and is stored in the memory 82 of the control part 80 in advance. The height h of the electronic component 13a from the reference plane can be detected from the positional offset amount 2e between the image 14a and the image 14b by using this map.

As described above, the bonding apparatus 100 of the present embodiment can detect the height h of the electronic component 13a from the reference plane using a simple method for acquiring the images 14a and 14b of the electronic component 13a located at a position higher than the reference plane (focusing plane) by alternately turning on the right and left LEDs 32 of the illumination unit 30 of the imaging apparatus 85 mounted in the bonding apparatus 100.

Meanwhile, in the bonding apparatus 100 of the present embodiment, a configuration has been described in which the height h of the electronic component 13a from the reference plane is detected from the positional offset amount 2e between the image 14a and the image 14b using the map as shown in FIG. 6, but a relational expression between the positional offset amount 2e between the image 14a and the image 14b and the height h of the electronic component 13a from the focusing plane (reference plane) may be created in advance, and height detection may be performed by converting the positional offset amount 2e between the image 14a and the image 14b into the height h using the relational expression. In addition, in a case where the bonding stage 11 can move in the Z direction, a map or a relational expression between the positional offset amount 2e and the height h from the Z direction may be created in advance by moving the bonding stage 11 in the Z direction.

Hereinbefore, a configuration has been described in which the images 14a and 14b of the electronic component 13a located at a position higher than the reference plane (focusing plane) are acquired by alternately turning on the right and left LEDs 32 of the illumination unit 30 of the imaging apparatus 85 mounted in the bonding apparatus 100 and the height h of the electronic component 13a from the reference plane is detected. However, as will be described below, the image 14a of the electronic component 13a may be acquired by turning on the LED 32 located at the position of optical axis 24 of the first portion of the illumination unit 30, that is, the LED 32 disposed at the center of the illumination unit 30, and next the image 14a or 14b of the electronic component 13a may be acquired by turning on the right or left LED 32 of the illumination unit 30, to thereby detect the height h of the electronic component 13a from the reference plane on the basis of the positional offset amount e between the image 14a acquired by turning on the LED 32 disposed at the center of the illumination unit 30 and the image 14a acquired by turning on the right LED of the illumination unit 30 or the positional offset amount e between the image 14a acquired by turning on the LED 32 disposed at the center of the illumination unit 30 and the image 14b acquired by turning on the left LED of the illumination unit 30.

As described with reference to FIG. 2 previously, the light of the LED 32 disposed at the center of the illumination unit 30 illuminates the electronic component 13a from the vertically upward direction of the electronic component 13a through the optical paths 41, 44, and 45 which are vertical optical paths, and thus the reflected light from the electronic component 13a also proceeds in the vertically upward direction. Therefore, even in the case of the electronic component 13a which is higher than the focusing plane (reference plane) of the optical system 20 only by a height h, the image 14a of the electronic component 13a which is formed on the imaging surface 71 is located at the same position as the image 14 of the electronic component 13, and a positional offset does not occur between the image 14 and the image 14a. In addition, as described with reference to FIGS. 3 and 4 previously, in a case where the electronic component 13a is illuminated and imaged with illumination from a direction inclined only at an angle φ from the optical axis 24 of the first portion to the right, the image 14a is shifted downward only by a distance e in accordance with the height h of the electronic component 13a. Therefore, the image 14a acquired by turning on the LED 32 disposed at the center of the illumination unit 30 and the image 14a acquired by turning on the right LED 32 of the illumination unit 30 are separated from each other by the positional offset amount e.

Consequently, the height h of the electronic component 13a from the reference plane can be detected using the positional offset amount e between the image 14a acquired by turning on the LED 32 disposed at the center of the illumination unit 30 and the image 14a acquired by turning on the right LED of the illumination unit 30. In this case, the height h may be calculated by doubling the ratio of the height h to the positional offset amount detected using the map shown in FIG. 6. In addition, a configuration may be used in which the positional offset amount e between the image 14a acquired by turning on the LED 32 disposed at the center of the illumination unit 30 and the image 14a acquired by turning on the right LED of the illumination unit 30 are measured by changing the Z-direction height of the bonding stage 11 or the Z-direction height of the optical system 20, the same map as that in FIG. 6 is created and is stored in the memory 82 of the control part 80 in advance, and the height h is calculated from the positional offset amount e using this map. In addition, similarly, the height h of the electronic component 13a from the reference plane can also be detected using the positional offset amount e between the image 14a acquired by turning on the LED 32 disposed at the center of the illumination unit 30 and the image 14b acquired by turning on the left LED 32 of the illumination unit 30.

Figure 7:
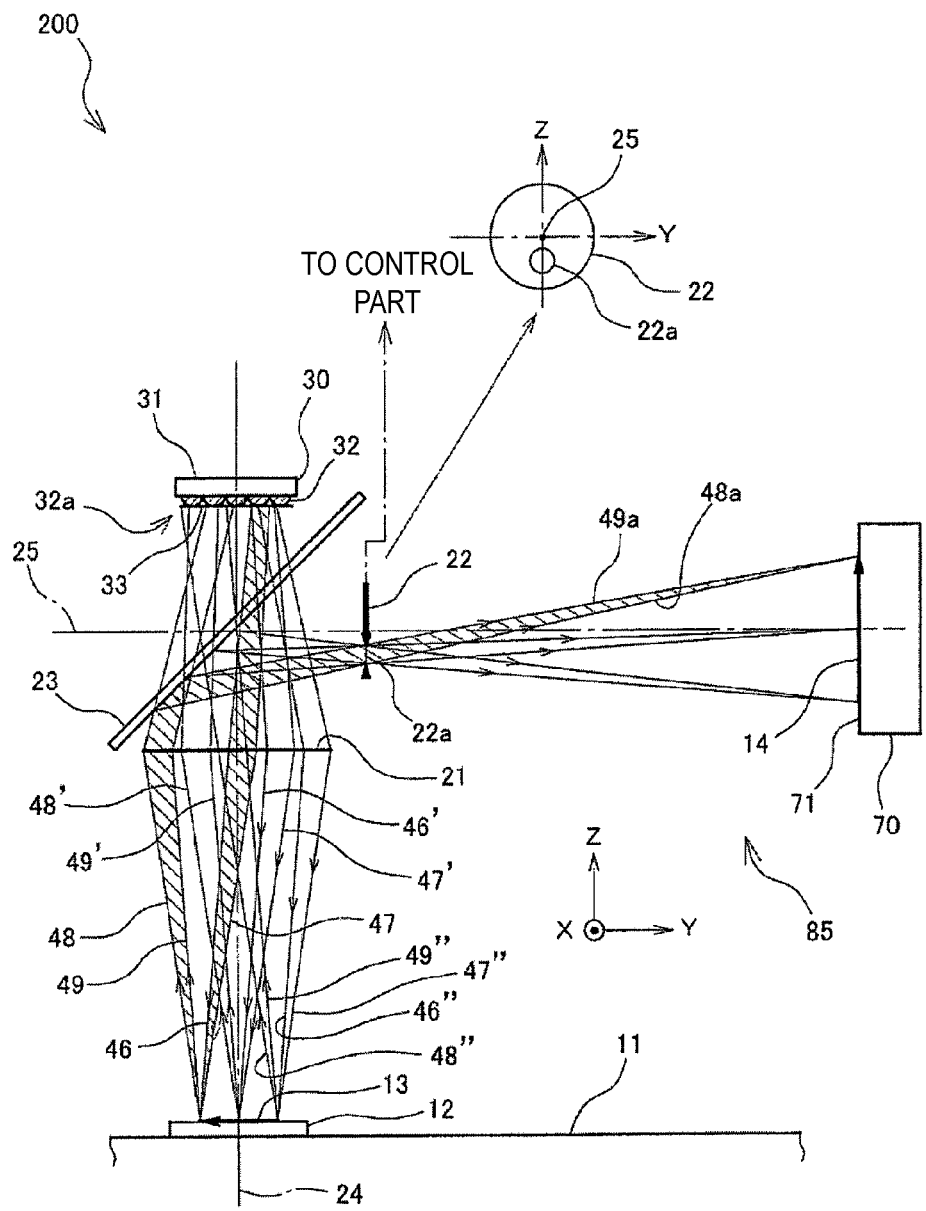
FIG. 7 is an optical path diagram in a case where, in a bonding apparatus according to another embodiment of the present invention, an opening of a diaphragm is set to a position allowing passage of reflected light when the subject is illuminated with illumination light from the diagonal upper right through and an image of a subject is acquired.

Next, another embodiment will be described with reference to FIGS. 7 and 8. As shown in FIG. 7, a bonding apparatus 200 of the present embodiment is configured such that the diaphragm 22 of the bonding apparatus 100 previously described with reference to FIGS. 1 to 6 has a small opening 22a at a position eccentric from the optical axis 25 of the second portion, and that the diaphragm 22 is rotatable around the optical axis 25 of the second portion. Portions previously described with reference to FIGS. 1 to 6 are denoted by the same reference numerals and signs, and thus the description thereof will not be given.

First, a case in which the opening 22a of the diaphragm 22 is located on the lower side of the optical axis 25 of the second portion will be described with reference to FIG. 7. A plurality of LEDs 32 of the illumination unit 30 are all turned on, but light is shielded in regions other than the opening 22a of the diaphragm 22. Therefore, only light passing through the opening 22a of the diaphragm 22 reaches the imaging surface 71 of the imaging element 70, and thus an image of the electronic component 13 or the electronic component 13a having only a height h can be formed.

As shown in FIG. 7, the opening 22a of the diaphragm 22 is located on the lower side of the optical axis 25 of the second portion. This position is the same position as a position at which the reflected light when the electronic component 13 is illuminated by turning on only the right LED 32 of the illumination unit 30 described with reference to FIG. 3 passes through the diaphragm 22. Therefore, in a case where the opening 22a of the diaphragm 22 is located on the lower side of the optical axis 25 of the second portion, only the light from the right LED 32 described with reference to FIG. 3 can form the image 14 of the electronic component 13 on the imaging surface 71 of the imaging element 70 even in a case where the plurality of LEDs 32 of the illumination unit 30 are all turned on. That is, by setting the position of the opening 22a of the diaphragm 22 to be on the lower side of the optical axis 25 of the second portion, even in a case where the plurality of LEDs 32 of the illumination unit 30 are all turned on, this state can be made the same as in a case where the electronic component 13 is illuminated with light passing through the optical path inclined to the right with respect to the optical axis 24 of the first portion similarly to that described with reference to FIG. 3.

Figure 8:
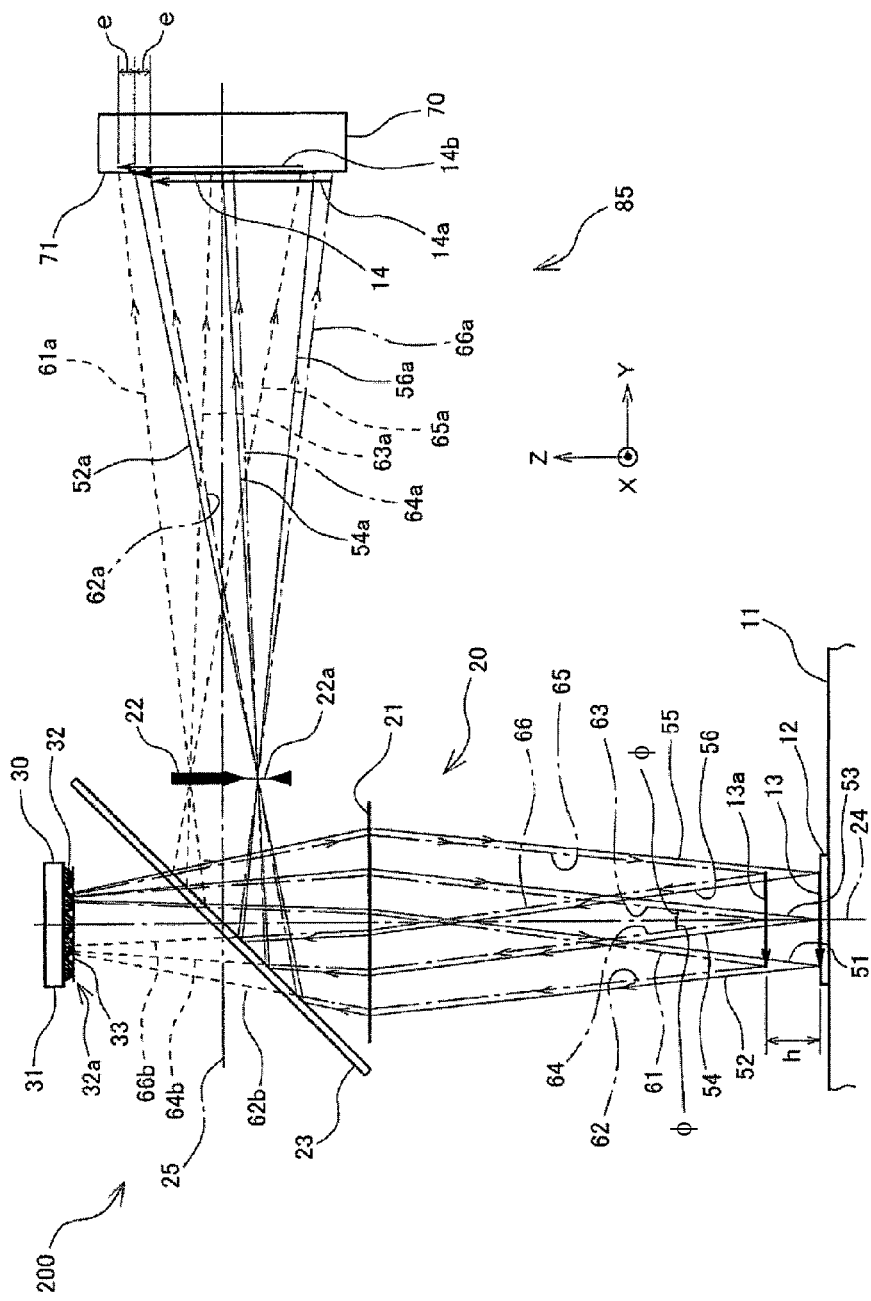
FIG. 8 is an optical path diagram illustrating a shift occurring in images on the imaging surface due to the height of a subject when an image of the subject is acquired through the optical path shown in FIG. 7.

Therefore, as shown in FIG. 8, optical paths when the electronic component 13 and the electronic component 13a are illuminated with light from one LED 32 shifted to the right from the optical axis 24 of the first portion and the image 14 and the image 14a which is a first image are formed on the imaging element 70 are the same as the optical paths 51 to 56, 52a, 54a, and 56a and the optical paths 61 to 66, 62a, 64a, and 66a described with reference to FIG. 4.

In addition, in a case where the position of the opening 22*a* is set to be on the upper side of the optical axis 25 of the second portion by rotating the diaphragm 22, even when the plurality of LEDs 32 of the illumination unit 30 are all turned on reversely to the case shown in FIG. 7, this state is made the same as in a case in which the electronic component 13 is illuminated with light passing through the optical path inclined to the left with respect to the optical axis 24 of the first portion. In this case, optical paths when the electronic component 13*a* is illuminated with light from one LED 32 shifted to the left from the optical axis 24 of the first portion and the image 14*b* which is a second image is formed on the imaging element 70 are the same as the optical paths 62*b*, 64*b*, and 66*b* and the optical paths 61 to 66, 61*a*, 63*a*, and 65*a* described with reference to FIG. 4.

As described above, the control part 80 rotates the diaphragm 22 around the optical axis 25 of the second portion, acquires the image 14*a* which is a first image of the electronic component 13*a* with the position of the opening 22*a* set to be on the lower side of the optical axis 25 of the second portion, next acquires the image 14*b* which is a second image of the electronic component 13*a* with the position of the opening 22*a* set to be on the upper side of the optical axis 25 of the second portion, and measures the positional offset amount 2*e* between the image 14*a* and the image 14*b*, thereby allowing the height h of the electronic component 13*a* from the reference plane to be detected using a relational expression between the map shown in FIG. 6 or the positional offset amount 2*e* and the height h.

As described above, the bonding apparatus 200 of the present embodiment can detect the height h of the electronic component 13*a* from the reference plane using a simple method for acquiring the images 14*a* and 14*b* of the electronic component 13*a* located at a position higher than the reference plane (focusing plane) by rotating the diaphragm 22 and alternately moving the position of the opening 22*a* to the lower side and the upper side of the optical axis 25 of the second portion in a state where the illumination unit 30 is fully turned on.

Figure 9:
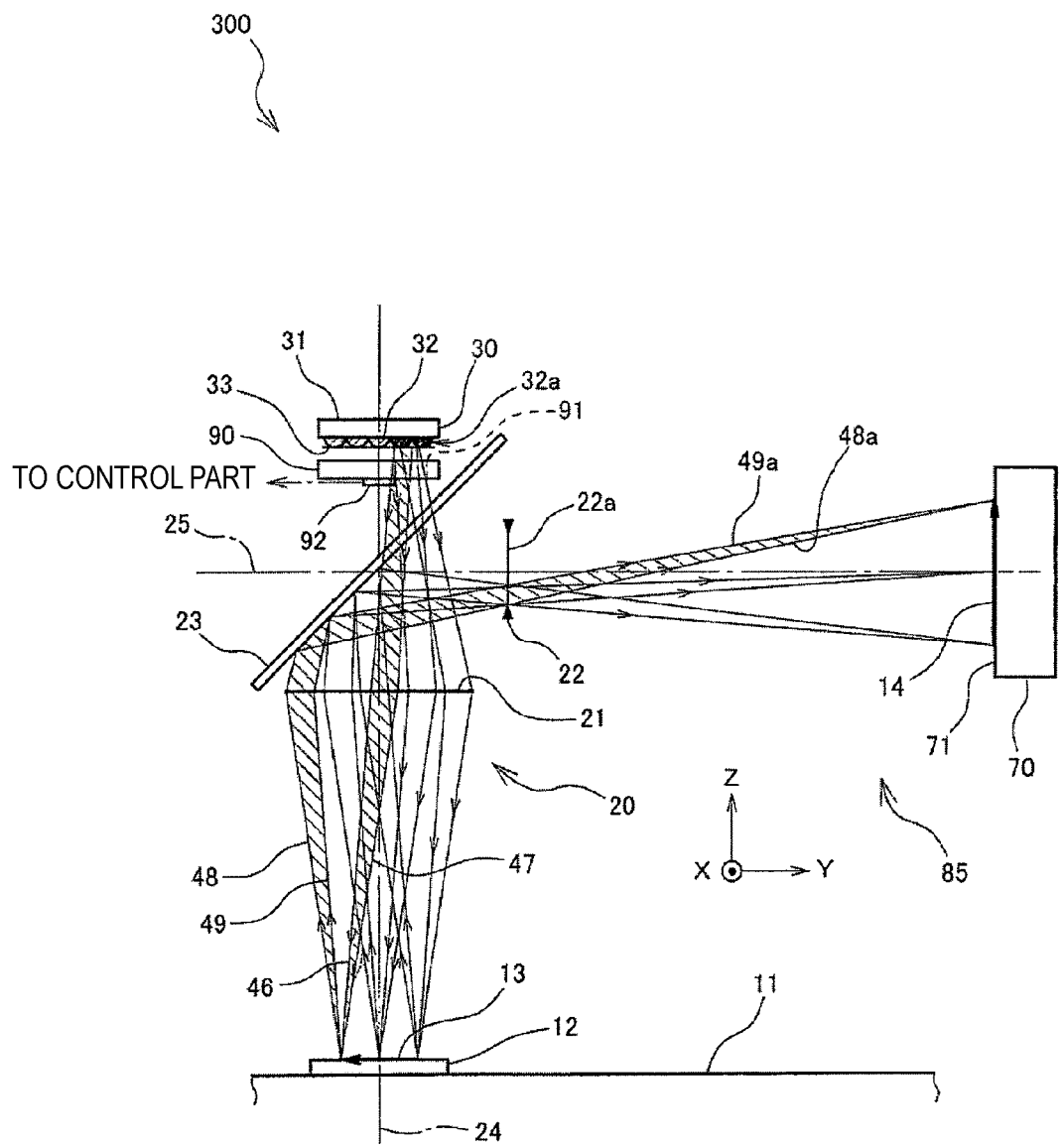
FIG. 9 is an optical path diagram in a case where, in a bonding apparatus according to another embodiment of the present invention, an image is acquired with the position of a hole of a shielding plate located at the right side.

Next, another embodiment will be described with reference to FIGS. 9, 10(*a*) and 10(*b*). As shown in FIG. 9, a bonding apparatus 300 of the present embodiment is configured such that a shielding plate 90 is disposed between the illumination unit 30 and the half mirror 23 of the bonding apparatus 100 described with reference to FIGS. 1 to 6. Parts previously described with reference to FIGS. 1 to 6 are denoted by the same reference numerals and signs, and thus the description thereof will not be given.

Figure 10A:
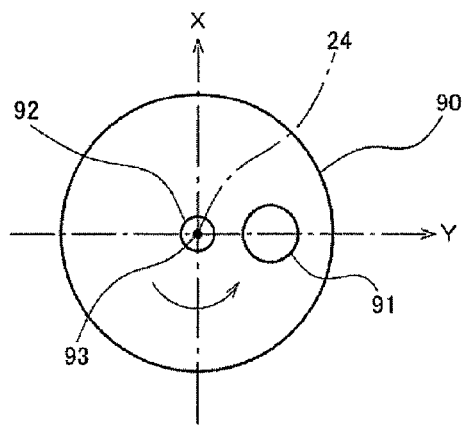
FIG. 10(a) and FIG. 10(b) are plan views of the shielding plate which is used in an embodiment shown in FIG. 9.
Figure 10B:
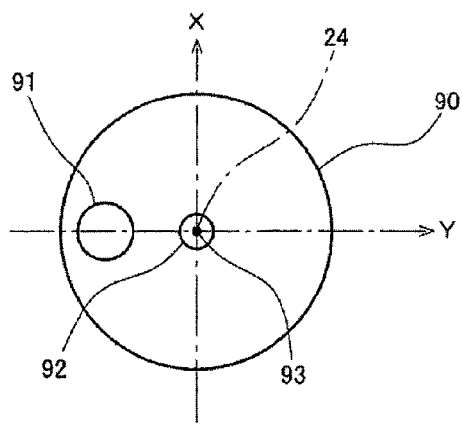

As shown in FIGS. 9, 10(*a*), and 10(*b*), the shielding plate 90 is configured such that a hole 91 for transmitting light from the LED array 32*a* is provided eccentrically from a center 93, and is installed such that the center 93 is coaxial with the optical axis 24 of the first portion. In addition, the shielding plate 90 is configured to include a hub 92 having a rotary drive mechanism such as a motor built-in, and to rotate around the optical axis 24 in accordance with a command from the control part 80.

FIG. 10(*a*) shows that the hole 91 is located on the positive side in the Y direction, that is, the position of the right LED 32 of the LED array 32*a* shown in FIG. 9, allows passage of light of the right LED 32 of the LED array 32*a*, and shields light of other LEDs 32. This state is the same state as in a case where only the right LED 32 of the illumination unit 30 described previously is turned on. Similarly, FIG. 10(*b*) shows that the hole 91 is located on the negative side in the Y direction, that is, the position of the left LED 32 of the LED array 32*a* shown in FIG. 9, allows passage of light of the left LED 32 of the LED array 32*a*, and shields light of other LEDs 32. This state is the same state as in a case where only the left LED 32 of the illumination unit 30 described with reference to FIG. 4 is turned on.

The control part 80 brings the rotary drive mechanism in the hub 92 into operation, acquires the image 14*a* of the electronic component 13*a* which is a first image as described with reference to FIG. 4 with the hole 91 of the shielding plate 90 located at a position shown in FIG. 10(*a*), and acquires the image 14*b* of the electronic component 13*a* which is a second image as described with reference to FIG. 4 with the hole 91 of the shielding plate 90 located at a position shown in FIG. 10(*b*), thereby allowing the height h of the electronic component 13*a* from the reference plane to be detected from the positional offset amount 2*e* between the image 14*a* and the image 14*b* using the map described with reference to FIG. 6.

The bonding apparatus 300 of the present embodiment can detect the height h of the electronic component 13*a* from the reference plane using a simple method for acquiring the image 14*a* which is a first image and the image 14*b* which is a second image of the electronic component 13*a* located at a position higher than the reference plane (focusing plane) in the same state as in a case where both the right and left LEDs 32 are alternately turned on by rotating the shielding plate 90 on the lower side of the illumination unit 30 of the imaging apparatus 85 mounted in the bonding apparatus 300.

In each embodiment described above, a configuration has been described in which the height h of the electronic component 13*a* from the reference plane located at a position higher than the reference plane is detected, but the height h of the electronic component 13*a* from the reference plane can be detected using a similar method even in a case where the electronic component 13*a* is located at a position lower than the reference plane.

Next, reference will be made to FIG. 11 to describe a method for detecting a mount state of each of bonding tools 161 to 163 mounted on a tool changer 160 using an imaging apparatus 150 in a bonding apparatus 400.

The bonding apparatus 400 includes a Y-direction guide 110, a Y-direction movable part 120 which is guided by the Y-direction guide 110 and moves in the Y direction, a bonding head 130 attached to the Y-direction movable part 120, and an imaging apparatus 150. A pick-up part 140 that vacuum-absorbs a bonding tool is attached to the leading end of the bonding head 130. The imaging apparatus 150 includes the optical system 20, the illumination unit 30, and the imaging element 70 which have been previously described with reference to FIGS. 1 to 6. The control part is disposed together with the control apparatus of the entire bonding apparatus 400. The control part is not shown in the drawing. In addition, the Y-direction guide 110 is moved in the X direction by an X-direction drive apparatus (not shown). Therefore, the bonding head 130 and the imaging apparatus 150 move in an XY direction.

Figure 11:
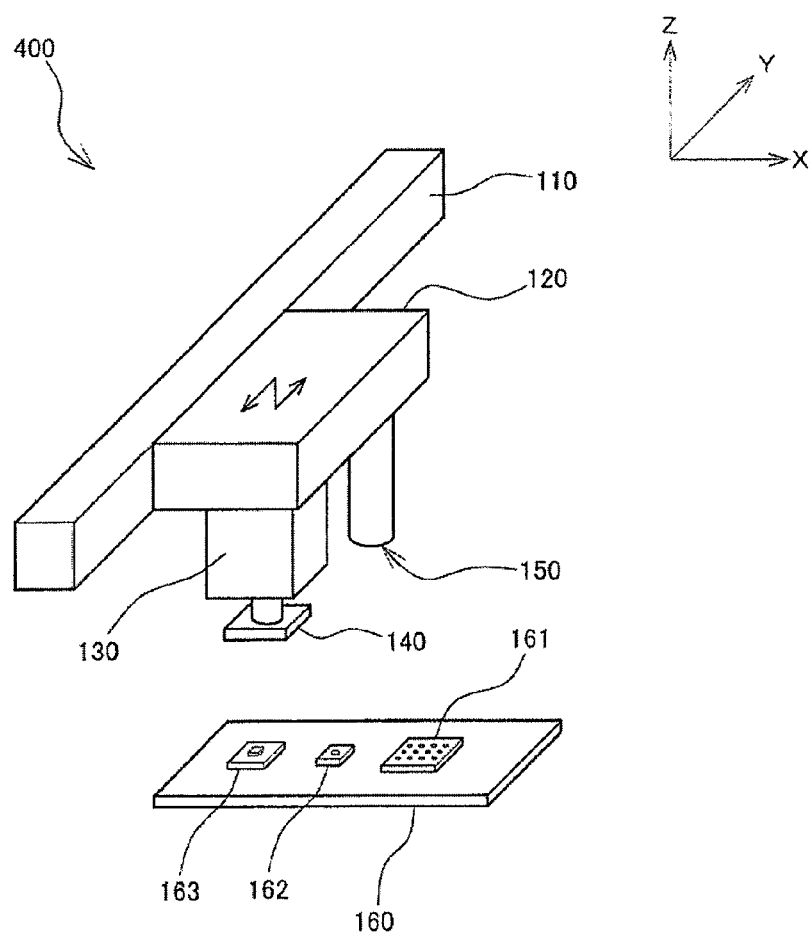
FIG. 11 is a perspective view illustrating a configuration of a bonding apparatus including a tool changer.

As shown in FIG. 11, various types of bonding tools are mounted on the tool changer 160. The bonding apparatus 400 is configured such that the bonding head 130 is moved in the XY direction by the Y-direction movable part 120 and the X-direction drive apparatus (not shown), and that the imaging apparatus 150 is moved onto the bonding tool 161. The heights h of three or more positions of the bonding tool 161 are detected using the method previously described with reference to FIGS. 1 to 6, and the inclination of the surface of the bonding tool 161 is calculated from a difference between the detected heights. In a case where the inclination of the surface of the bonding tool 161 is equal to or greater than a predetermined angle, the control part (not shown) determines that the pick-up part 140 of the bonding apparatus 400 is mounted on the tool changer in a state where the pick-up part is not able to pick up the bonding tool 161 followed by outputting an error, and stops the operation of the bonding apparatus 400. Meanwhile, in a case where the control part 80 determines that the bonding tool 161 is mounted on the tool changer in a state where the bonding tool is not able to be picked up, the control part may bring another apparatus (not shown) into operation to mount the bonding tool 161 again. The same operations are also performed on the bonding tools 162 and 163.

In addition, the imaging apparatus 85 of the present embodiment can be applied to the following various types of measurements. For example, in a wire bonding apparatus, a die bonding apparatus or a flip-chip bonding apparatus, the flatness of the substrate 12 can be detected by detecting the heights h from the reference plane with respect to three points on the surface of the substrate 12.

Further, the bonding apparatus 100 of the present embodiment can be applied to the measurement of the height of the substrate 12 or the electronic component 13 which is a bonding target before bonding in a wire bonding apparatus, a die bonding apparatus or a flip-chip bonding apparatus as follows.

In the recognition of a bonding target before bonding, two alignment points on the electronic component 13 or the substrate 12 are imaged by the imaging apparatus 85, and positioning of the electronic component 13 is performed by recognizing an image acquired by the control part 80. In that case, a plurality of images of the electronic component 13 or images of a plurality of substrates 12 are acquired by switching turn-on and turn-off of the right and left LEDs 32 of the illumination unit 30 as described with reference to FIGS. 1 to 6 or switching the position of the opening 22a of the diaphragm 22 between the upper side and the lower side of the optical axis 25 of the second portion as described with reference to FIGS. 7 and 8, and thus it is possible to measure the height of the electronic component 13 or the substrate 12 which is a bonding target before bonding.

Normally, alignment points for performing the positioning of the electronic component 13 are two points, but in a case where the inclination of the electronic component 13 does not matter, the height of the electronic component 13 can be measured using one alignment point. Since three points are required to be measured in a case where the plane inclination of the electronic component 13 is required to be measured, the height of another point may be measured in addition to two alignment points for performing the positioning.

In a case where a height can be detected during alignment before bonding, it is possible to lower a search level during bonding (a height at which the descending speed of the bonding tool becomes slow), and to expect an improvement in tact time. In addition, in a flip-chip bonder, the flatness of the upper surface of a laminated chip changes for every lamination. Therefore, in a case where the electronic component 13 is laminated further thereon, the original setting and flatness of the bonding tool change, and thus the quality of bonding may be lowered. Therefore, in a case where the flatness of the upper surface of a laminated chip can be understood in advance, it is possible to enhance the quality of bonding by correcting the flatness and performing bonding.

In addition, in a case where the measurement of the height of the electronic component 13 or the substrate 12, the measurement of flatness, or the measurement of the inclination of the electronic component 13 as described above is performed, when an imaging area is divided in accordance with switching between turn-on and turn-off of the right and left LEDs 32 of the illumination unit 30 as described with reference to FIGS. 1 to 6 or switching of the position of the opening 22a of the diaphragm 22 as described with reference to FIGS. 7 and 8, and a shift in a pattern within the area is calculated, heights and flatness within the divided area can be understood, and heights within the area can be measured collectively. Optimum three-dimensional measurement according to purposes can be performed by making the divided area fine or coarse.

In addition, the imaging apparatus 85 of the present embodiment can determine the quality of wire bonding by detecting the loop height of a wire bonding apparatus, the height of a crimped ball, or the like. In addition, the imaging apparatus can also be applied to the detection of the height of a paste in a die bonding apparatus.

As described above, the imaging apparatus 85 of the present embodiment can also be applied to the detection of the heights of various components on the bonding stage of the bonding apparatus.

The invention claimed is:

1. A bonding apparatus comprising:
   an optical system that forms an image of a bonding target having a predetermined pattern;
   an image sensor that acquires the image formed by the optical system as a picture;
   an illumination unit that includes a plurality of light sources and illuminates the bonding target through an optical path of the optical system; and
   a control part that processes the image acquired by the image sensor,
   wherein the control part illuminates the bonding target through a first optical path of the optical system facing the bonding target and causes the image sensor to acquire an image of the predetermined pattern of the bonding target as a first pattern image,
   illuminates the bonding target through a second optical path inclined with respect to the first optical path and causes the image sensor to acquire the image of the predetermined pattern of the bonding target as a second pattern image, and
   calculates an amount of variation from a reference height of the bonding target on the basis of an positional offset amount between the first pattern image and the second pattern image.

2. The bonding apparatus according to claim 1,
   wherein
   the control part illuminates the bonding target through the first optical path by turning on a first light source disposed at a first position within the illumination unit and turning off other light sources and causes the image sensor to acquire the first pattern image, and
   illuminates the bonding target through the second optical path by turning on a second light source disposed at a second position different from the first position and turning off other light sources and causes the image sensor to acquire the second pattern image.

3. The bonding apparatus according to claim 1,
   wherein the first optical path is a first inclined optical path inclined with respect to an optical axis of a first portion of the optical system facing the bonding target, the second optical path is a second inclined optical path inclined toward the opposite side from the first inclined optical path with respect to the optical axis of the first portion, and the control part illuminates the bonding target through the first inclined optical path by turning on a first light source disposed at a first position eccentric from the optical axis of the first portion within the illumination unit and turning off other light sources and causes the image sensor to acquire the first pattern image, and illuminates the bonding target through the second inclined optical path by turning on a second light source disposed at a second position on the opposite side of the first position with respect to the optical axis of the first portion and turning off other light sources and causes the image sensor to acquire the second pattern image.

4. The bonding apparatus according to claim 1, wherein the first optical path is a vertical optical path along an optical axis of a first portion of the optical system facing the bonding target, the second optical path is a second inclined optical path inclined with respect to the optical axis of the first portion, and the control part illuminates the bonding target through the vertical optical path by turning on a first light source disposed coaxially with the optical axis of the first portion within the illumination unit and turning off other light sources and causes the image sensor to acquire the first pattern image, and illuminates the bonding target through the second inclined optical path by turning on a second light source disposed at a second position separated from the optical axis of the first portion and turning off other light sources and causes the image sensor to acquire the second pattern image.

5. The bonding apparatus according to claim 1, wherein the first optical path is a first inclined optical path inclined with respect to an optical axis of a first portion of the optical system facing the bonding target, the second optical path is a second inclined optical path inclined toward the opposite side from the first inclined optical path with respect to the optical axis of the first portion, the bonding apparatus includes a shielding plate that is rotatable around the optical axis of the first portion and provided with a hole for transmitting light from the illumination unit and eccentric from a center, the center being coaxial with the optical axis of the first portion of the optical system, and the control part causes the hole to locate at a first position eccentric from the optical axis of the first portion when the illumination unit is turned on and the first pattern image is acquired, and to locate the hole at a second position on the opposite side of the first position with respect to the optical axis of the first portion when the second pattern image is acquired.

6. The bonding apparatus according to claim 1, wherein the first optical path is a first inclined optical path inclined with respect to an optical axis of a first portion of the optical system facing the bonding target, the second optical path is a second inclined optical path inclined toward the opposite side from the first inclined optical path with respect to the optical axis of the first portion, the optical system includes a lens and a diaphragm disposed between the lens and the image sensor, and the diaphragm has an opening allowing passage of reflected light with which the bonding target is illuminated through the first inclined optical path or the second inclined optical path at a position eccentric from an optical axis of a second portion passing through the diaphragm of the optical system.

7. The bonding apparatus according to claim 6, wherein the diaphragm is rotatable around the optical axis of the second portion, and the control part sets the position of the opening to a position allowing passage of reflected light with which the bonding target is illuminated through the first inclined optical path when the first pattern image is acquired by the image sensor, and sets the position of the opening to a position allowing passage of reflected light with which the bonding target is illuminated through the second inclined optical path when the second pattern image is acquired by the image sensor.

8. The bonding apparatus according to claim 1, wherein the optical system is a telecentric optical system.

9. A method for calculating an amount of variation from a reference height of a bonding target having a predetermined pattern, the method comprising:

preparing an imaging apparatus including an optical system that forms an image of the bonding target, an image sensor that acquires the image formed by the optical system as a picture, an illumination unit that includes a plurality of light sources and illuminates the bonding target through an optical path of the optical system, and a control part that processes the image acquired by the image sensor;

illuminating the bonding target through a first optical path of the optical system facing the bonding target and causing the image sensor to acquire an image of the predetermined pattern of the bonding target as a first pattern image;

illuminating the bonding target through a second optical path inclined with respect to the first optical path and causing the image sensor to acquire the image of the predetermined pattern of the bonding target as a second pattern image; and calculating an amount of variation from a reference height of the bonding target on the basis of an positional offset amount between the first pattern image and the second pattern image.

10. The method for calculating an amount of variation from a reference height of a bonding target having a predetermined pattern according to claim 9, wherein the first optical path is a first inclined optical path inclined with respect to an optical axis of a first portion of the optical system facing the bonding target, the second optical path is a second inclined optical path inclined toward the opposite side from the first inclined optical path with respect to the optical axis of the first portion, and the method further comprising:

illuminating the bonding target through the first inclined optical path by turning on a first light source disposed at a first position eccentric from the optical axis of the first portion within the illumination unit and turning off other light sources and causing the image sensor to acquire the first pattern image; and illuminating the bonding target through the second inclined optical path by turning on a second light source disposed at a second position on the opposite side of the first position with respect to the optical axis of the first portion and turning off other light sources and causing the image sensor to acquire the second pattern image.

11. The method for calculating an amount of variation from a reference height of a bonding target having a predetermined pattern according to claim 9,
wherein the first optical path is a first inclined optical path inclined with respect to an optical axis of a first portion of the optical system facing the bonding target,
the second optical path is a second inclined optical path inclined toward the opposite side from the first inclined optical path with respect to the optical axis of the first portion,
the optical system includes a lens and a diaphragm disposed between the lens and the image sensor,
the diaphragm has an opening allowing passage of reflected light with which the bonding target is illuminated through the first inclined optical path or the second inclined optical path at a position eccentric from an optical axis of a second portion passing through the diaphragm of the optical system, and is rotatable around the optical axis of the second portion,
the position of the opening is set to a position allowing passage of reflected light with which the bonding target is illuminated through the first inclined optical path when the first pattern image is acquired by the image sensor, and
the position of the opening is set to a position allowing passage of reflected light with which the bonding target is illuminated through the second inclined optical path when the second pattern image is acquired by the image sensor.

* * * * *